(12) United States Patent
Bryant et al.

(10) Patent No.: US 6,239,591 B1
(45) Date of Patent: May 29, 2001

(54) METHOD AND APPARATUS FOR MONITORING SOI HYSTERISES EFFECTS

(75) Inventors: Andres Bryant; Edward J. Nowak; Minh Ho Tong, all of Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/303,358

(22) Filed: Apr. 29, 1999

(51) Int. Cl.⁷ .................................................. G01R 19/55
(52) U.S. Cl. .................... 324/158.1; 324/765; 368/113; 368/118
(58) Field of Search ...................... 331/111, 57; 340/663; 324/158.1, 765; 368/113, 118; 439/16–18

(56) References Cited

U.S. PATENT DOCUMENTS

| | | |
|---|---|---|
| 4,719,608 | 1/1988 | Genat et al. . |
| 4,890,270 | 12/1989 | Griffith . |
| 5,083,299 | 1/1992 | Schwanke et al. . |
| 5,396,183 | 3/1995 | Farwell et al. . |
| 5,457,400 | 10/1995 | Ahmad et al. . |
| 5,459,437 * | 10/1995 | Campbell ............................. 331/111 |
| 5,513,152 | 4/1996 | Cabaniss . |
| 5,550,517 * | 8/1996 | Saito .................................... 331/111 |
| 5,619,463 | 4/1997 | Malhi . |
| 5,952,891 * | 9/1999 | Boudry .................................. 331/57 |
| 5,995,011 * | 10/1999 | Kurihara et al. ..................... 340/663 |

* cited by examiner

Primary Examiner—Safet Metjahic
Assistant Examiner—Jimmy Nguyen
(74) Attorney, Agent, or Firm—Scully, Scott, Murphy & Presser; Eugene I. Shkurko, Esq.

(57) ABSTRACT

A system and method for measuring hysteresis effects of a wafer process. The method comprises steps of generating a pulse having a pulse width equal to the delay of a transition through a delay chain wherein the delay chain has been in a static condition for a substantial length of time; counting a number of oscillations from a ring oscillator generated during the pulse width wherein the ring oscillator has been operating in a steady state condition; comparing the number of oscillations with an expected value; and correlating a difference resulting from the comparing step with a level of hysteresis effected by the wafer process.

8 Claims, 2 Drawing Sheets

METHOD AND APPARATUS FOR MONITORING SOI HYSTERISES EFFECTS

BACKGROUND OF THE INVENTION

1. Field of the Invention

The present invention is directed to integrated circuit fabrication and test methodologies, and, particularly, to a novel method and system for in-line monitoring of hysteresis effects exhibited by silicon-on-insulator (SOI) wafer manufacturing process.

2. Discussion of the Prior Art

It is commonly known that the SOI floating body results in hysterises effects whereby the delay through a set of SOI circuits depends on the input history. Manufacturing control of this history effect is critical. Methods to measure SOI hysteresis effects are readily available, but require the use of high speed measurement equipment and high-frequency test probes that are not amenable to inline manufacturing high-throughput and inexpensive testing/monitoring/characterization.

It would be highly desirable to provide an SOI hysteresis test structure that eliminates the need for non-standard, high-frequency inline test equipment and test probes.

Moreover, it would additionally be highly desirable to provide an SOI hysteresis test structure that may be wholly implemented within the kerf of the chip, separate from other active chip circuits.

SUMMARY OF THE INVENTION

It is an object of the invention to provide an apparatus and test methodology that measures the history effect associated with a floating body in a manufacturing environment. The SOI hysteresis test structure eliminates the need for non-standard inline test equipment, and moreover, may be wholly implemented within the kerf of the chip. Furthermore, the test technique may be implemented with standard voltmeters, for instance, and is simple and efficient to carry out providing for higher wafer throughput.

In this invention, a first switch delay through a long chain of SOI inverters that has been in a "DC" state for every long time is compared to the "steady state" delay through a short SOI inverter ring oscillator. The difference in the DC and steady state delays bound the hysterises effects for the inverter circuits. The two delays are compared via an on-chip counter, eliminating the need for high-speed test equipment or probe sets.

According to the principles of the invention, there is provided an apparatus and method for measuring hysteresis effects of a wafer process, the method comprising: generating a pulse having a pulse width equal to the delay of a transition through a delay chain wherein the delay chain has been in a static condition for a substantial length of time; counting a number of oscillations from a ring oscillator generated during the pulse width wherein the ring oscillator has been operating in a steady state condition; comparing the number of oscillations with an expected value; and correlating a difference resulting from the comparing step with a level of hysteresis effected by the wafer process.

BRIEF DESCRIPTION OF THE DRAWINGS

Further features, aspects and advantages of the apparatus and methods of the present invention will become better understood with regard the following description, appended claims, and accompany drawings where:

DETAILED DESCRIPTION OF THE PREFERRED EMBODIMENT

Figure 1:
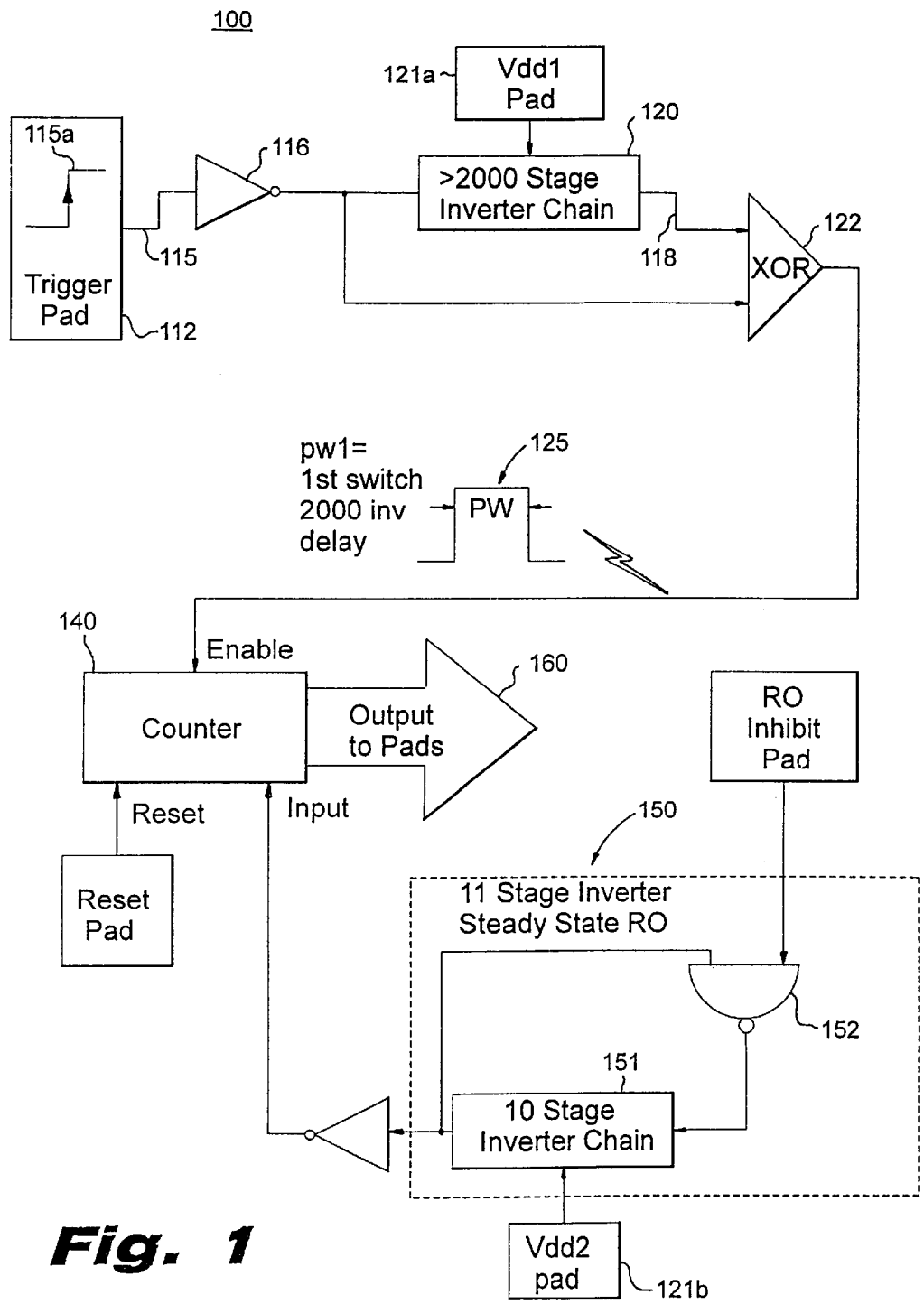
FIG. 1 illustrates the in-line, SOI history monitoring apparatus according to a first embodiment of the invention.

FIG. 1 illustrates the SOI hysteresis inline monitoring apparatus 100 according to a first embodiment of the invention. This inline monitor is formed at the edge of the wafer or a "kerf" location apart from other active chip circuits. As shown in FIG. 1, there is provided a first chain 120 of inverter devices (not shown) connected serially. For exemplary purposes, the first inverter chain 120 comprises about 2000 inverter stages although any amount may be implemented as will be hereinafter described. Additionally, as will be described, the first inverter chain 120 is maintained at an initial state; e.g., DC state, for a long period of time, e.g., greater than about 100 milliseconds (msec.). The apparatus 100 further includes a trigger pad 112 for initiating generation of a test signal 115, e.g., comprising a rising edge 115a which is input to the first inverter chain 120 through inverter 116a for propagation therethrough. Through an inverter device 116, the test signal 115 is additionally applied to a first input of an XOR gate 122. The output 118 of the first inverter chain 120 is applied to a second input of the XOR gate 122. With these inputs, the output of the XOR gate is a pulse signal 125 having a width PW equal to the time delay of the first inverter chain 120. This pulse output signal 125 is used to enable a counter device 140 for counting a number of oscillations generated by a second inverter chain 150. This second inverter chain comprises a serial connection of about eleven (11) inverter devices (e.g., ten (10) inverter stages 151 plus a NAND gate 152 as shown in FIG. 1) connected together to function as a ring oscillator (RO) 150 as it will be hereinafter referred to. It should be understood that the amount of inverter stages comprising the first inverter chain 120 and the RO circuit 150 are configurable and will change according to amount of resolution desired for the measured hysteresis effect and the type of circuit and technology implemented.

As shown in FIG. 1, a first and second Vdd input pads 121a, 121b, are provided for powering both the first inverter chain 120 and second inverter chain (RO) 150, respectively. The RO device 150 operates in steady state. Additionally, for proper hysteresis effect monitoring, the RO 150 is made up of the very same inverter circuits as those comprising the first inverter chain 120. Thus, by knowing the number of stages in the RO 150 and first inverter chain 120, there is an expected number of oscillations that should be counted by counter device 140 during the on-time of output pulse 125 of width W corresponding to a first switch delay, $Ds_1$, i.e., proportional to the time it takes the edge 115a of test signal 115 to propagate through the first inverter chain 120. According to the invention, the pulse width is measured by counter 140 which counts the number of oscillations of the smaller RO chain 150. As the RO device 150 is in a steady state operation, its delay is a steady-state delay, Dss, and constitutes an average of a first and second switch delays of an inverter chain 150. According to the invention, then, a comparison is made between the first switch delay $Ds_1$ (through the first inverter chain 120) to the steady-state delay Dss (through RO 150). The output 160 of the counter 140 represents a result of this comparison, i.e., a measure of the first switching delay Dsl relative to the steady-state delay, as will be explained in greater detail.

The test methodology according to the invention requires propagating the test signal 115 through the long inverter chain 120 that is greater than about 2000 inverter stages long and that has been in a DC state for a long time. The pulse signal 125 is then generated having a width PW equal to the time it takes for the rising (or falling) edge of the test signal 115 to travel through the inverter chain 120. This pulse signal 125 simultaneously enables counter device 140 to count the number of oscillations of the eleven (11) stage inverter RO 150. The test requires a comparison between the first switch delay through the long inverter chain 120 to the steady-state delay through the eleven stage RO device 150. Thus, the width of pulse signal 125 is PW=2000 Ds$_1$, where Ds$_1$ is the first switch delay through one (1) stage. The period of the RO is PRO=11·Dss where Dss is the steady state RO stage delay. The output count "N" of the counter device 140 is then proportional to the ratio of DS$_a$ and Dss, as follows:

$$N=PW/PRO=2000 \cdot Ds_1/11 \cdot Dss=182 Ds_1/Dss.$$

Thus, a measure of the manufacturing process hysteresis effect is attained. For example, if there is no circuit hysteresis effects, the output would be about 182. Otherwise, the output N of the counter is proportional to the ratio of Ds$_1$ and Dss.

According to the example provided herein, the time resolution for measuring the hysteresis effect is 0.5% a stage delay when using a 2000 stage chain in conjunction with an 11 stage RO. That is, the resolution is proportional to the ratio of the first chain length and the RO length. So the first inverter chain may be made very long, or the RO stage may be made very small, according to the desired resolution. For example, it may be expected that the first switch stage delay (Ds$_1$) is about 5% slower/faster than the steady-state stage delay (Dss). So with the 2000/11 ratio of first inverter chain length to RO inverter chain length, a 10% deviation in "Hysterisis" effects may be measured.

It should be understood that the sensitivity of the apparatus 100, may be accentuated by providing a unique lower Vdd to the long chain.

Figure 2:
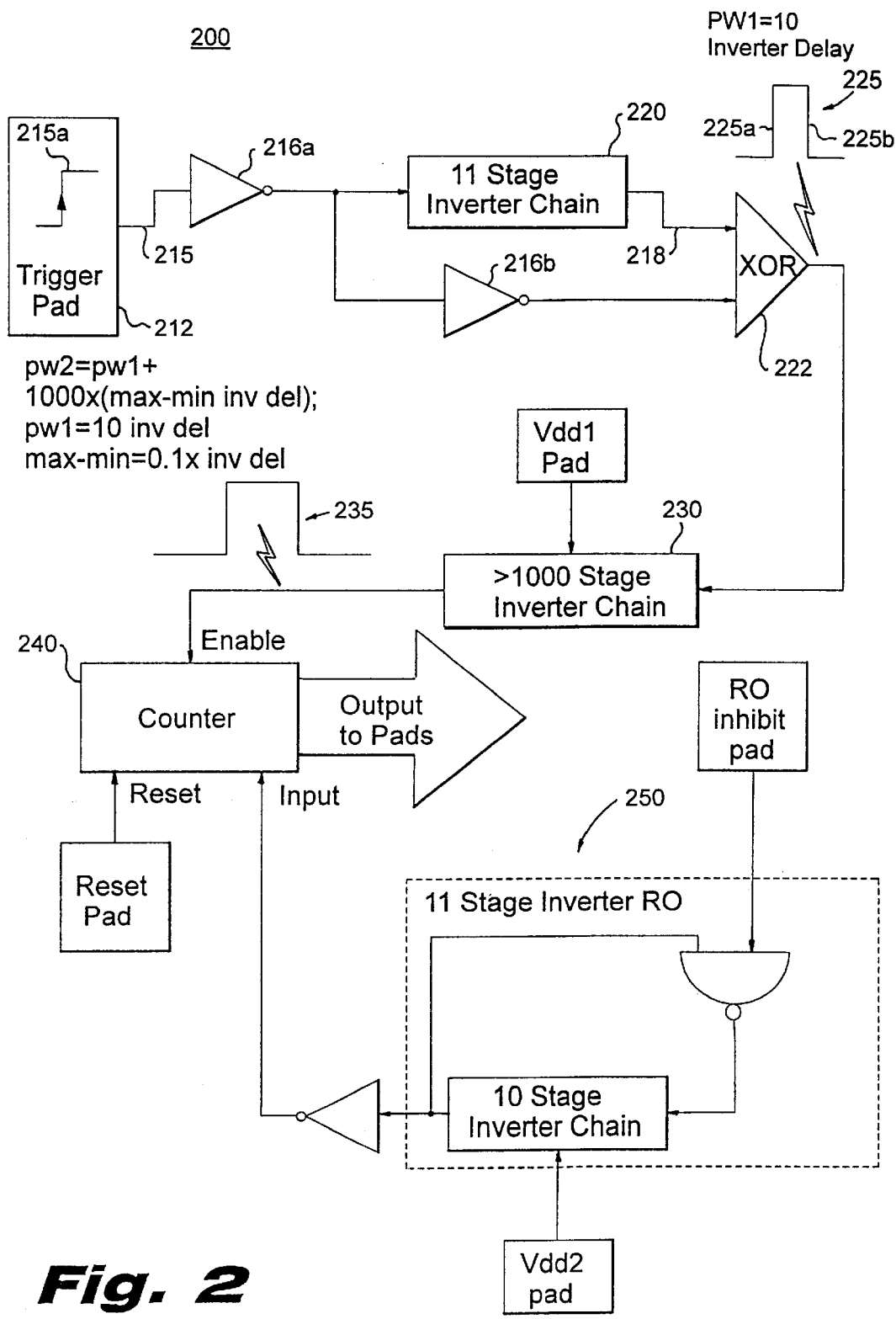
FIG. 2 illustrates the in-line, SOI history monitoring apparatus according to a second embodiment of the invention.

FIG. 2 illustrates the SOI hysteresis inline monitoring apparatus 200 according to a second embodiment of the invention. In this embodiment, a comparison is made between a first versus a second switch delay through a sufficiently long inverter chain (>1000 inverter stages). As shown in FIG. 2, there is provided a first inverter chain 220 of inverter devices (not shown) connected serially. For exemplary purposes, the first inverter chain 220 comprises about 11 inverter stages (not shown). The apparatus 200 further includes a trigger pad 212 for initiating generation of a test signal 215, e.g., comprising a rising edge 215a which is input to the first inverter chain 220 through inverter 216a for propagation therethrough. Through one or more inverter devices 216a, 216b, the test signal 215 is additionally applied to a first input of an XOR gate 222. The output 218 of the first inverter chain 220 is applied to a second input of the XOR gate 222. With these inputs, the output of the XOR gate 222 is a narrow, on-chip pulse signal 225 having a narrow width PW equal to approximately (PW1) of approximately 10 inverter stage delays, i.e., the time delay of the first inverter chain 220. This pulse output signal 225 is propagated through a long inverter chain 230 that is, for example, greater than 1000 inverter stages long. According to the preferred embodiment, it is assumed that the chain has been in a DC state for a long time, e.g., greater than 100 msec., and, the rising edge 225a of the pulse 225 (first switch) propagates faster through the long inverter chain 230 than the falling edge 225b (second switch) since the long inverter chain does not have sufficient time to equilibrate to the inverted "DC" state before the falling edge arrives. Consequently, the output pulse 235 of long inverter chain 235 is, therefore, widened significantly to have a width PW2 such that:

$$PW2=PW1+1000 \cdot (Ds_1-Ds_2)$$

where Ds$_1$=first switch delay/stage and, Ds$_2$=second switch delay/stage and (Ds$_1$-Ds$_2$) equals the difference in speed between the first and second switch (multiplied by 1000 stages), and, is assumed equal to about ten percent (10%) of an average inverter stage delay (ISD). Since, approximately (Ds$_1$-DS$_2$)/ISD=0.1, where ISD is the average inverter stage delay (Dss), then, the output PW2 of the long inverter chain 230 is:

$$PW2=10 \cdot ISD+1000 \cdot (0.1 \cdot ISD)=10\ ISD+100 ISD=110 ISD.$$

(It should be understood that the PW1=10 ISD can be neglected as PW1 is much smaller). Thus, as performed for the case of the first embodiment, the pulse PW2 is used to enable a counter device 240 for counting a number of oscillations generated by a third inverter chain 250. This third inverter chain 250 comprises a serial connection of about eleven (11) inverter devices connected together to function as a ring oscillator (RO) 250 as it is hereinafter referred. It should be understood that the amount of inverter stages comprising the long inverter chain 230 and the RO circuit 250 are configurable and will change according to amount of resolution desired for the measured hysteresis effect and the type of circuit and technology implemented.

As in the first embodiment, the counter 240 counts the number "N" of oscillations of the 11 stage inverter ring oscillator and this amount represents the width of the pulse PW2 and is proportional to (Ds$_1$-Ds$_2$), i.e., the difference between the first and second switch delay, as follows:

$$N=PW/PRO=1000 \cdot Ds_1-Ds_2/11 \cdot Dss$$

$$N/100 \approx (Ds_1-Ds_2)/Dss$$

Thus, in this second embodiment, the width PW2 is measured in terms of ISDs. That is, the output N of the counter divided by approximately 100 is (Ds$_1$-DS$_2$)/Dss, or, in other words, the difference between the first and second switch delay, relative to the average (steady state) stage delay.

It should be understood that, the second embodiment may be implemented only in the case that the first switch delay Ds$_1$ is shorter than the second switch delay Ds$_2$, i.e., Ds$_1$<DS$_2$. As in the first embodiment, the resolution provided by the circuit according to the second embodiment is about 1% of an ISD (for a 1000 stage chain).

While the invention has been particularly shown and described with respect to illustrative and preformed embodiments thereof, it will be understood by those skilled in the art that the foregoing and other changes in form and detail may be made therein without departing from the spirit and scope of the invention which should be limited only by the scope of the appended claims.

What is claimed is:

1. Method for measuring SOI floating-body time-delay hysteresis effects of a wafer process, the method comprising:

generating a pulse having a pulse width equal to the delay of a transition through a multi-stage delay chain formed in said wafer, wherein the delay chain has been in a static condition for a substantial length of time, said pulse width representing a delay time corresponding to a first switch delay;

for a time duration equal to said pulse width, counting a number of oscillations from a ring oscillator constructed of the same individual stages that are used in said multi-stage delay chain and operating in steady-state condition, said oscillations of said ring oscillator comprising pulses with each pulse representing an average steady state stage delay time for said ring oscillator, said number of oscillations being proportional to a ratio of said first switch time-delay to said average ring oscillator steady state time-delay; and comparing the number of oscillations with an expected value, wherein a difference between a measured number of oscillations and said expected value represents deviations in said time-delay hysteresis, said deviations in said time-delay hysteresis correlating to variations in said wafer process.

2. Method for measuring SOI floating-body time-delay hysteresis effects of a wafer process, the method comprising:

generating a first pulse having a first pulse width equal to the delay of a transition through a first delay chain formed in said wafer, said first pulse width representing a delay time corresponding to a first switch delay/stage;

propagating said first pulse through a second delay chain constructed of the same individual stages that are used in said first delay chain, wherein the second delay chain has been in a static condition for a substantial length of time, and obtaining a second pulse at an output of said second delay chain, said second pulse having a second pulse width representing a difference between said first switch/delay per stage and a second switch/delay per stage, said second switch delay being greater than said first switch delay;

for a time duration equal to said second pulse width, counting a number of oscillations from a ring oscillator constructed of the same individual stages that are used in said second and first delay chains and operating in steady-state condition, said oscillations of said ring oscillator comprising pulses with each pulse representing an average steady state stage delay time for said ring oscillator, said number of oscillations being proportional to a ratio between said difference between a first switch/delay per stage and a second switch/delay per stage, and to said ring oscillator average steady state delay;

comparing the number of oscillations with an expected value, wherein a difference between a measured number of oscillations and said expected value represents deviations in said time-delay hysteresis, said deviations in said time-delay hysteresis correlating to variations in said wafer process.

3. Apparatus for measuring SOI floating-body time-delay hysteresis effects of a wafer process comprising:

pulse generator means for generating a pulse having a pulse width equal to a delay of a transition through a multi-stage delay chain formed in said wafer, wherein the delay chain has been in a static condition for a substantial length of time, said pulse width representing a delay time corresponding to a first switch delay;

oscillator means constructed of the same individual stages that are used in said multi-stage delay chain and operating in steady state for generating an oscillation stream of pulses, each pulse representing an oscillator average steady state stage delay time for said ring oscillator;

counter means for counting a number of oscillations from said oscillator means generated during said pulse width, said number of oscillations from said oscillator means being proportional to a ratio of said first switch time-delay to said average steady state time-delay, wherein a difference between a measured number of oscillations and said expected value represents deviations in said time-delay hysteresis, said deviations in said time-delay hysteresis correlating to variations in said wafer process.

4. The apparatus as claimed in claim 3, wherein said multi stage delay chain comprises a serial connection of inserter devices having a first number of stages, said oscillator means comprising a ring oscillator including a serial connection of inverter devices having a second number of stages, wherein said second number of stages is smaller than said first number of stages.

5. The apparatus as claimed in claim 4, wherein said second number of stages comprises about 10% of said first number of stages of said multi stage delay chain.

6. The apparatus as claimed in claim 4, wherein inverter stages of said ring oscillator are of identical physical design as inverter stages of said multi stage delay chain.

7. Apparatus for measuring SOI floating-body time-delay hysteresis effects of a wafer process comprising:

pulse generator means for generating a first pulse having a first narrow pulse width;

multi-stage delay chain for receiving said first pulse and generating a second pulse signal of second pulse width representing wafer hysteresis effects, said multi-stage delay chain having been in a static condition for a substantial length of time, said second pulse width representing a difference between a first switch delay corresponding to a delay caused by propagating a rising edge of said first narrow pulse through said multi-stage delay chain and a second switch delay corresponding to a delay caused by propagating a falling edge of said first narrow pulse through said delay chain;

oscillator means constructed of the same individual stages that are used in said multi-stage delay chain and operating in steady state for generating an oscillation stream of pulses, each pulse representing an oscillator average steady state stage delay time for said ring oscillator;

counter means for counting a number of oscillations from said oscillator means generated during said second pulse width, said number of oscillations from said oscillator means being proportional to a ratio between said difference between a first switch/delay per stage and a second switch/delay per stage of said first pulse through said multi-stage delay chain, and to said ring oscillator average steady state delay, whereby said number of oscillations is compared with a value expected for said wafer process to determine deviations in said time-delay hysteresis correlating to variations in said wafer process.

8. The apparatus as claimed in claim 7, wherein said second switch delay through said multi-stage delay chain is longer than said first switch delay through said multi-stage delay chain.

* * * * *

UNITED STATES PATENT AND TRADEMARK OFFICE
CERTIFICATE OF CORRECTION

PATENT NO.    : 6,239,591 B1
DATED         : May 29, 2001
INVENTOR(S)   : A. Bryant et al.

It is certified that error appears in the above-identified patent and that said Letters Patent is hereby corrected as shown below:

<u>Column 3,</u>
Line 17, "$DS_a$" should read -- $Ds_1$ --.

<u>Column 6,</u>
Line 9, "time delay" should read -- time-delay --
Lines 12 and 13, "multi stage" should read -- multi-stage --
Line 13, "inserter" should read -- inverter --
Line 21, "multi stage" should read -- multi-stage --
Line 24, "multi stage" should read -- multi-stage --
Line 58, "time delay" should read -- time-delay --

Signed and Sealed this

Twenty-fifth Day of June, 2002

*Attest:*

*Attesting Officer*

JAMES E. ROGAN
*Director of the United States Patent and Trademark Office*